(12) United States Patent
Nakamura et al.

(10) Patent No.: US 9,030,223 B2
(45) Date of Patent: May 12, 2015

(54) TEST CARRIER

(75) Inventors: Kiyoto Nakamura, Miyagi (JP);
Yoshinari Kogure, Saitama (JP)

(73) Assignee: Advantest Corporation, Tokyo (JP)

( * ) Notice: Subject to any disclaimer, the term of this patent is extended or adjusted under 35 U.S.C. 154(b) by 407 days.

(21) Appl. No.: 13/502,655

(22) PCT Filed: May 10, 2010

(86) PCT No.: PCT/JP2010/057898
§ 371 (c)(1),
(2), (4) Date: Jun. 5, 2012

(87) PCT Pub. No.: WO2011/048834
PCT Pub. Date: Apr. 28, 2011

(65) Prior Publication Data
US 2012/0235699 A1    Sep. 20, 2012

(30) Foreign Application Priority Data

Oct. 19, 2009    (JP) ................................. 2009-240654

(51) Int. Cl.
| | | |
|---|---|---|
| *G01R 31/26* | (2014.01) | |
| *G01R 31/28* | (2006.01) | |
| *H01L 21/683* | (2006.01) | |
| *H01L 23/544* | (2006.01) | |
| *H01L 23/00* | (2006.01) | |

(52) U.S. Cl.
CPC ......... *G01R 31/2893* (2013.01); *Y10T 29/4913* (2015.01); *Y10T 29/49131* (2015.01); *Y10T 29/53183* (2015.01); *Y10T 29/53174* (2015.01); *G01R 31/2891* (2013.01); *H01L 21/6835* (2013.01); *H01L 23/544* (2013.01); *H01L 24/81* (2013.01); *H01L 2223/5442* (2013.01); *H01L 2223/54426* (2013.01); *H01L 2224/81121* (2013.01); *H01L 2224/81801* (2013.01); *H01L 2924/09701* (2013.01); *H01L 2924/14* (2013.01); *H01L 2924/01019* (2013.01)

(58) Field of Classification Search
USPC .............. 324/756.01–756.07, 757.01–757.05
See application file for complete search history.

(56) References Cited

U.S. PATENT DOCUMENTS

| | | |
|---|---|---|
| 5,567,165 A | 10/1996 | Matsuoka |
| 5,757,199 A | 5/1998 | Maruyama |
| 5,828,224 A | 10/1998 | Maruyama |
| 5,986,459 A | 11/1999 | Fukaya et al. |

(Continued)

FOREIGN PATENT DOCUMENTS

| | | |
|---|---|---|
| CN | 1285615 | 2/2001 |
| JP | 7-201429 | 8/1995 |

(Continued)

OTHER PUBLICATIONS

Japan Office action, mail date is Nov. 12, 2013.

(Continued)

*Primary Examiner* — Tung X Nguyen
*Assistant Examiner* — Alesa Allgood
(74) *Attorney, Agent, or Firm* — Greenblum & Bernstein, P.L.C.

(57) ABSTRACT

A test carrier includes a base member and a cover member between which a die is interposed. The base film of the base member has: first interconnect patterns which are formed in advance; and a printing region where second interconnect patterns which electrically connect to the first interconnect patterns are to be formed by printing.

8 Claims, 19 Drawing Sheets

(56) References Cited

U.S. PATENT DOCUMENTS

| | | | |
|---|---|---|---|
| 6,064,217 A * | 5/2000 | Smith | 324/750.25 |
| 6,563,330 B1 | 5/2003 | Maruyama et al. | |
| 6,647,138 B1 | 11/2003 | Sakaguchi | |
| 6,774,650 B2 | 8/2004 | Maruyama et al. | |
| 7,160,123 B2 * | 1/2007 | Yamada et al. | 439/91 |
| 7,190,180 B2 * | 3/2007 | Yamada et al. | 324/755.08 |
| 7,746,333 B2 * | 6/2010 | Yamazaki et al. | 345/204 |
| 8,638,117 B2 * | 1/2014 | Kogure et al. | 324/757.01 |
| 2003/0160626 A1 | 8/2003 | Maruyama et al. | |

FOREIGN PATENT DOCUMENTS

| | | | | |
|---|---|---|---|---|
| JP | 7-263504 | | 10/1995 | |
| JP | 10-68758 | | 3/1998 | |
| JP | 10-213626 | | 8/1998 | |
| JP | 10-213627 | | 8/1998 | |
| JP | 11-326449 | | 11/1999 | |
| JP | 2003-344484 | * | 12/2003 | G01R 31/26 |
| JP | 3491700 | | 1/2004 | |
| KR | 10-0342031 | | 7/2002 | |

OTHER PUBLICATIONS

Korea Office action (KR Appl. No. 10-2010-0096730), mail date is Dec. 23, 2011.
Korea Office action (KR Appl. No. 10-2012-7009688), mail date is May 22, 2013.
China Office action, mail date is Mar. 29, 2012.
Taiwan Office action, mail date is Jun. 24, 2014.

* cited by examiner

TEST CARRIER

TECHNICAL FIELD

The present invention relates to a test carrier on which a die chip is temporarily mounted for testing an integrated circuit device or other electronic circuit device which is formed in the die chip.

BACKGROUND ART

As a test carrier on which a semiconductor chip in a bare chip state is temporarily mounted, there is known one which clamps the semiconductor chip between a lid member and a base member in an atmosphere which is reduced in pressure compared with the outside air (for example, see PLT 1).

The lid member of this test carrier is formed with interconnect patterns which correspond to electrodes of the semiconductor chip. The semiconductor chip is connected through these interconnect patterns to an outside test apparatus.

CITATIONS LIST

Patent Literature

PLT 1: Japanese Patent Publication (A) No. 7-263504

SUMMARY OF INVENTION

Technical Problem

If etching copper foil to form interconnect patterns, it is difficult to use a single test carrier to handle numerous types of semiconductor chips. On the other hand, it is possible to use ink jet printing to form interconnect patterns in real time and thereby enable a single test carrier to handle numerous types of semiconductor chips. However, if forming interconnect patterns by ink jet printing, there was the problem that the productivity of the test carrier became lower.

The problem to be solved by the present invention is to provide a test carrier which can handle numerous types of electronic devices and which is superior in productivity.

Solution to Problem

[1] The test carrier according to the present invention is a test carrier which comprises a first member and a second member between which an electronic device is interposed, the test carrier characterized in that the first member has first conduction paths which are formed in advance, and in that one of the first member or the second member has a first printing region where second conduction paths which are electrically connected to the first conduction paths are to be formed by printing.

[2] In the above invention, the first member may have a first film, the second member may have a second film which faces the first film, the first printing region may be provided on one of the first film or the second film, and the electronic device may be interposed between the first film and the second film.

[3] In the above invention, the first conduction paths may be connected to external terminals which are provided on the first film.

[4] In the above invention, the first member may further have a first frame which is formed with a first opening at its center and to which the first film is adhered, and the first conduction paths may be connected to external terminals which are provided on the first frame.

[5] In the above invention, the second member may further have a second frame which is formed with a second opening at its center and to which the second film is adhered.

[6] In the above invention, the first member may have a flat-plate shaped rigid board, the second member may have a film which faces the rigid board, the first printing region may be provided on one of the rigid board or the film, and the electronic device may be interposed between the rigid board and the film.

[7] In the above invention, the first conduction paths may also be connected to external terminals which are provided on the rigid board.

[8] In the above invention, the second member may also have a frame which is formed with an opening at its center and to which the film is adhered.

[9] In the above invention, the first member may have a film, the second member may have a flat-plate shaped rigid board which faces the film, the first printing region may be provided on one of the film or the rigid board, and the electronic device may be interposed between the film and the rigid board.

[10] In the above invention, the first conduction paths may be connected to external terminals which are provided on the film.

[11] In the above invention, the first member may further have a frame which is formed with an opening at its center and to which the film is adhered, and the first conduction paths may be connected to external terminals which are provided on the frame.

[12] In the above invention, the first member may have the first printing region, and the second member may have: third conduction paths which are formed in advance; and a second printing region where fourth conduction paths which are electrically connected to the third conduction paths are to be formed by printing.

[13] In the above invention, one of the first member or the second member may have: the second conduction paths; and an insulating layer which is formed over the parts of the second conduction paths corresponding to the edges of the electronic device.

[14] In the above invention, the second conduction paths may have pads which contact electrodes of the electronic device.

[15] In the above invention, the electronic device may be a die which is obtained by dicing from a semiconductor wafer.

[16] In the above invention, a holding space which is formed between the first member and the second member and which holds the electronic device may be reduced in pressure compared with the outside air.

Advantageous Effects of Invention

In the present invention, the second conduction paths are printed on the first printing region, so a single test carrier can be used to deal with a large variety of electronic devices.

Further, in the present invention, by forming the first conduction paths in advance, the second conduction paths are shortened, so the printing time of the second conduction paths can be shortened and the productivity of the test carrier can be improved.

DESCRIPTION OF EMBODIMENTS

Below, a first embodiment of the present invention will be explained based on the drawings.

Figure 1:
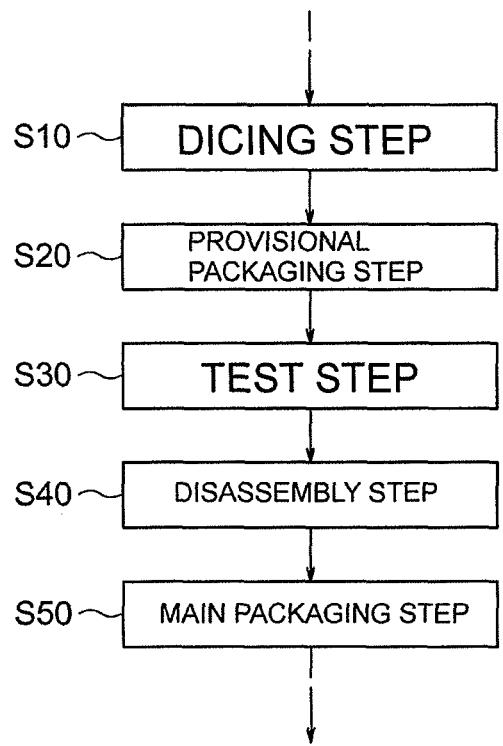
FIG. 1 is a flowchart showing part of a process of production of a device in a first embodiment of the present invention.

FIG. 1 is a flowchart showing part of a process of production of a device in the first embodiment of the present invention.

In the present embodiment, after a semiconductor wafer is diced (after step S10 of FIG. 1) and before final packaging (before step S50), an integrated circuit device or other electronic circuit device which is built into the die 90 is tested (steps S20 to S40).

In the present embodiment, first, the die 90 is temporarily mounted on a test carrier 10 (step S20). Next, through this test carrier 10, the die 90 is electrically connected to a test system (not shown) to thereby run a test on the electronic circuit device formed in the die 90 (step S30). Further, after this test is finished, the test carrier 10 is disassembled to take out the die 90 from the carrier 10 (step S40), then this die 90 is packaged by main packaging whereby the device is completed as a final product.

Below, a test carrier 10 on which a die 90 is temporarily mounted (provisionally packaged) in the present embodiment will be explained.

Figure 4:
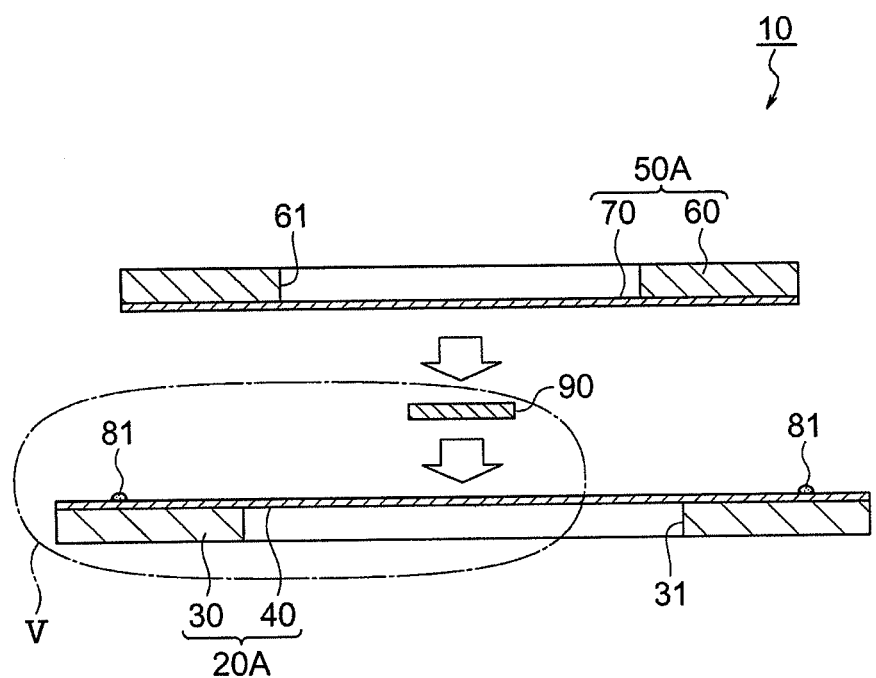
FIG. 4 is a disassembled cross-sectional view of the test carrier in the first embodiment of the present invention.
Figure 5:
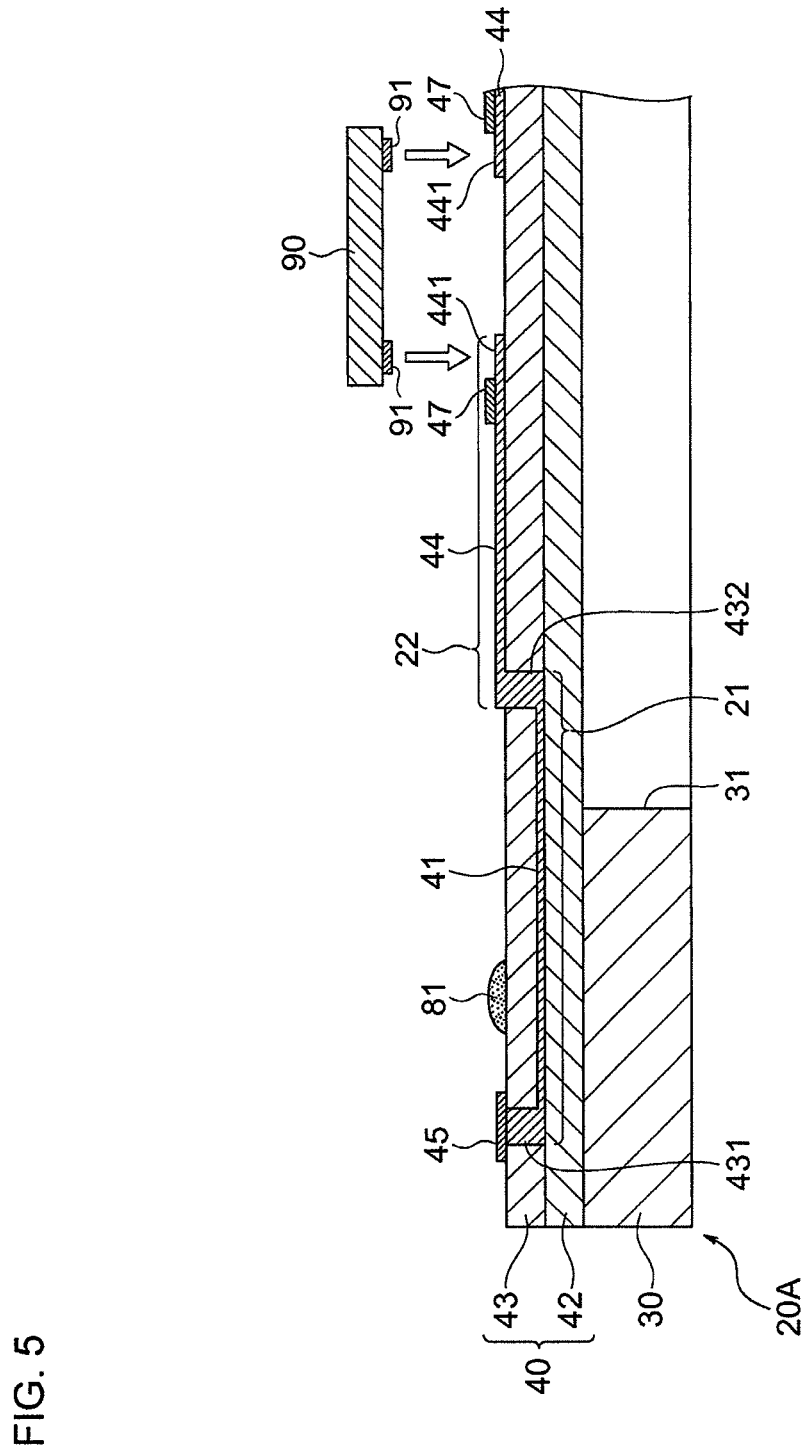
FIG. 5 is an enlarged view of part V in FIG. 4.
Figure 6:
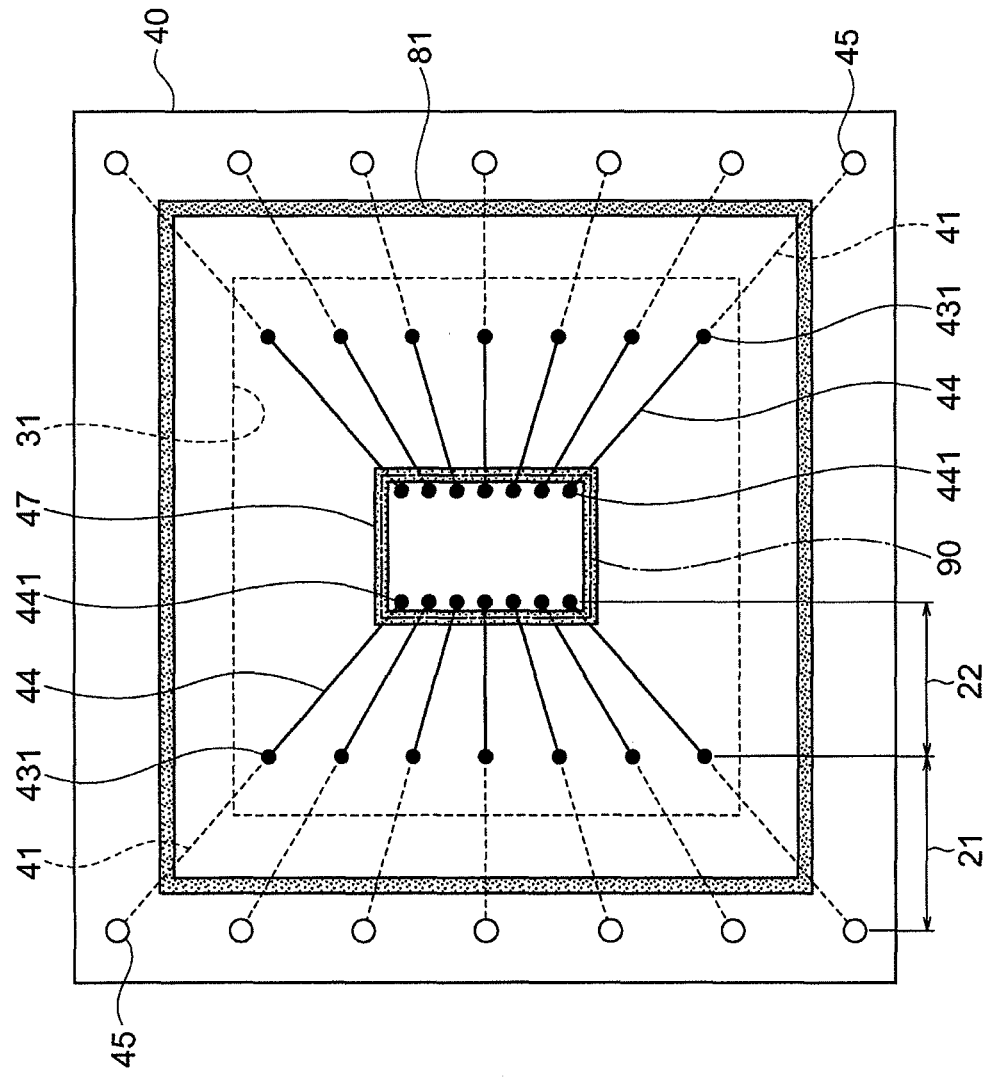
FIG. 6 is a plan view which shows a base member of the test carrier in the first embodiment of the present invention.

FIG. 2 to FIG. 5 are views which show a test carrier in the present embodiment, FIG. 6 is a view which shows a base member of that test carrier, and FIG. 7 to FIG. 12 are cross-sectional views showing modifications of the test carrier in the present embodiment.

Figure 2:
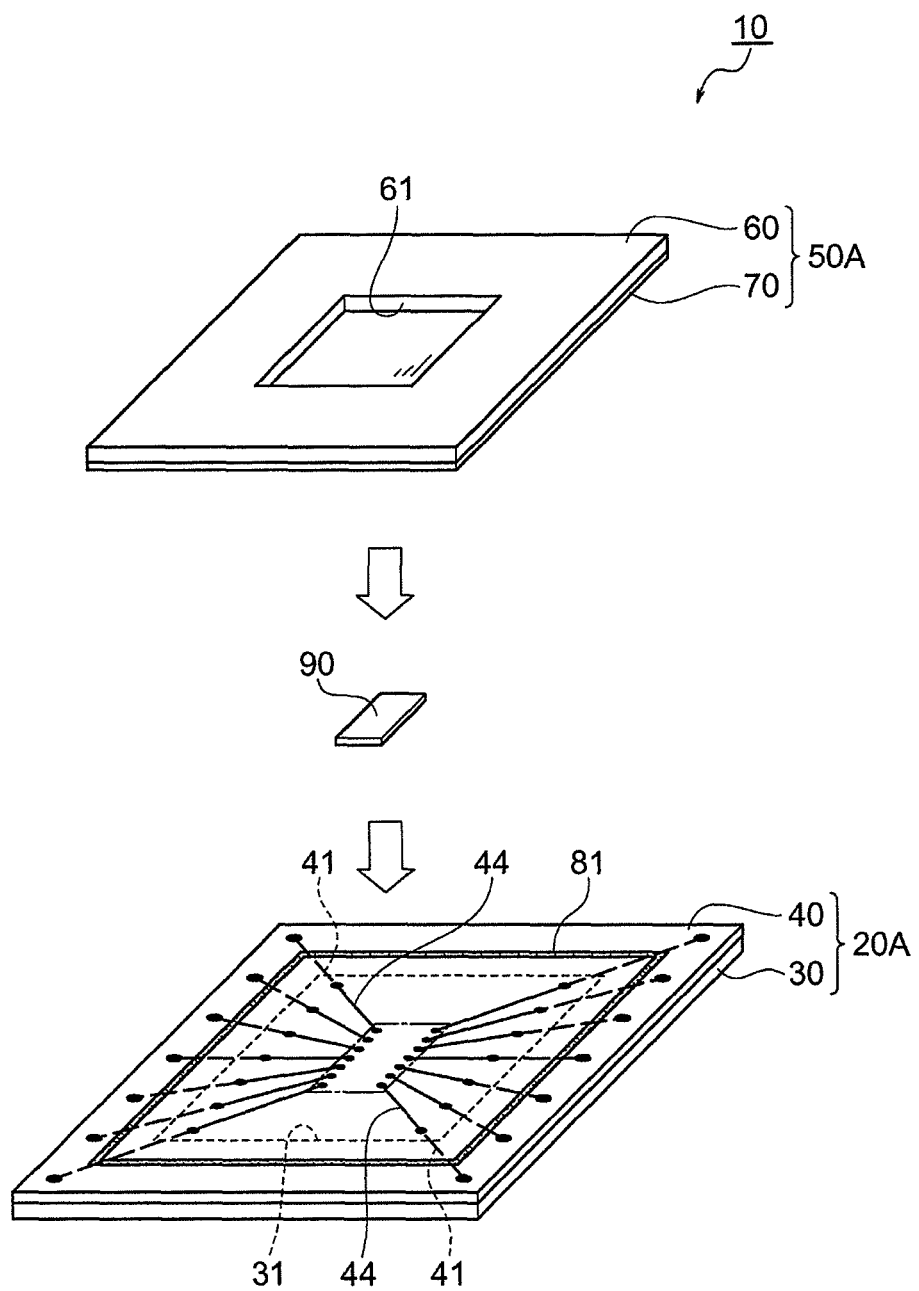
FIG. 2 is a disassembled perspective view of a test carrier in the first embodiment of the present invention.
Figure 3:
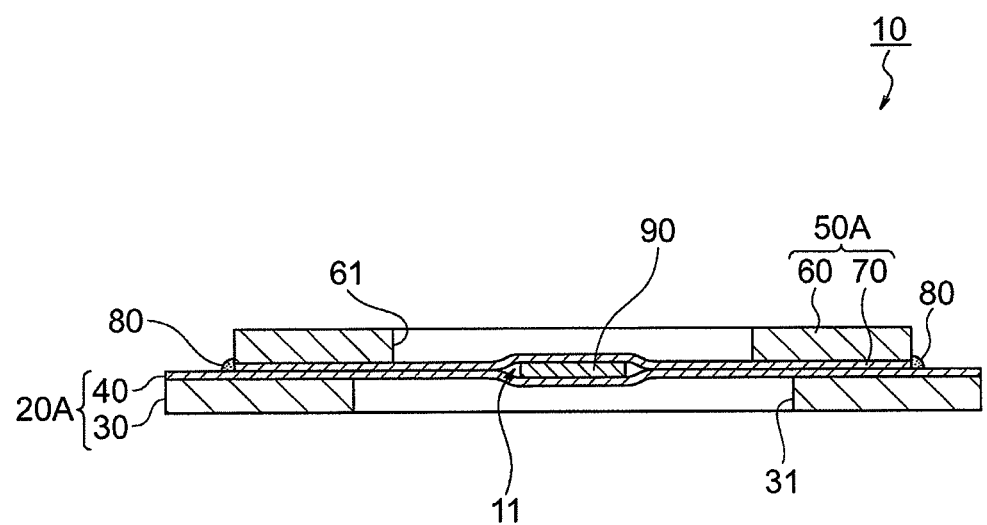
FIG. 3 is a cross-sectional view of the test carrier in the first embodiment of the present invention.

The test carrier 10 in the present embodiment, as shown in FIG. 2 to FIG. 4, comprises: a base member 20A on which a die 90 is to be placed; and a cover member 50A which is covered over this base member 20A. This test carrier 10 holds the die 90 by clamping the die 90 between the base member 20A and the cover member 50A in a state reduced in pressure from atmospheric pressure.

The base member 20A comprises a base frame 30 and a base film 40.

The base frame 30 is a rigid board which has a high rigidity (at least a rigidity higher than the base film 40 and the cover film 70) and which is formed with an opening 31 at its center. This base frame 30 is, for example, composed of a polyamide imide resin, ceramic, glass, etc.

The base film 40 is a film which has pliability and is adhered to the entire surface of the base frame 30, including the center opening 31, by a binder (not shown). In the present embodiment, the base film 40 which has pliability has the highly rigid base frame 30 adhered to it, so the handling ability of the base member 20A is improved.

As shown in FIG. 5, this base film 40 has: a base layer 42 on which first interconnect patterns 41 are formed; and a cover layer 43 which covers this base layer 42. Both of the base layer 42 and cover layer 43 of the base film 40 comprise for example polyimide films etc.

The first interconnect patterns 41 are, for example, formed in advance by etching copper foil which is laminated on the base layer 42. On the other hand, second interconnect patterns 44 are formed on the surface of the cover layer 43 by ink jet printing. The second interconnect patterns 44 are printed in real time by an interconnect forming apparatus (not shown) right before the die 90 is mounted on the base member 20A.

Note that, instead of ink jet printing, for example, laser printing may be used to form the second interconnect patterns 44. Further, the first interconnect patterns 41 in the present embodiment correspond to one example of the first conduction paths in the present invention, while the second interconnect patterns 44 in the present embodiments correspond to one example of the second conduction paths in the present invention.

As shown in FIG. 5 and FIG. 6, one end of each of the first interconnect patterns 41 is connected through a through hole 431 of the cover layer 43 to an external terminal 45. When testing the electronic circuit device of the die 90, a contact pin of the test apparatus contact with this external terminal 45.

On the other hand, the other end of each first interconnect pattern 41 is connected through a through hole 432 of the cover layer 43 to one end of a second interconnect pattern 44. The second interconnect pattern 44 has a pad 441 at its other end. This pad 441 is connected to an electrode 91 of the die 90.

Further, in the present embodiment, as shown in FIG. 5 and FIG. 6, an insulating layer 47 is formed on the base film 40 at a part corresponding to the edges of the die 90. This insulating layer 47 is for example composed of a solder resist etc. and has an electrical insulating property. By forming the insulating layer 47 on the second interconnect patterns 44 at the parts corresponding to the edges of the die 90, it is possible to prevent the edges of the die 90 from causing short circuits of the second interconnect patterns 44.

In the above way, in the present embodiment, it is possible to form second interconnect patterns 44 in accordance with the layout of electrodes 91 of the die 90 by ink jet printing in real time, so it is possible to use a single test carrier 10 to handle numerous types of dies 90.

Further, in the present embodiment, as shown in FIG. 5 and FIG. 6, the base member 20A has: a first region 21 in which the first interconnect patterns 41 are formed in advance; and a second region 22 in which second interconnect patterns 44 are formed by ink jet printing in real time. By employing such a configuration, the range of ink jet printing becomes smaller, so the printing time for the second interconnect patterns 44 can be shortened and the productivity of the test carrier 10 can be improved. Note that, the second region 22 in the present embodiment corresponds to one example of the first printing region in the present invention.

Note that, the positions of the pads and the positions of the external terminals are not particularly limited. They may be configured as shown in FIG. 7 to FIG. 11 explained below or may be configured by combining these.

Figure 7:
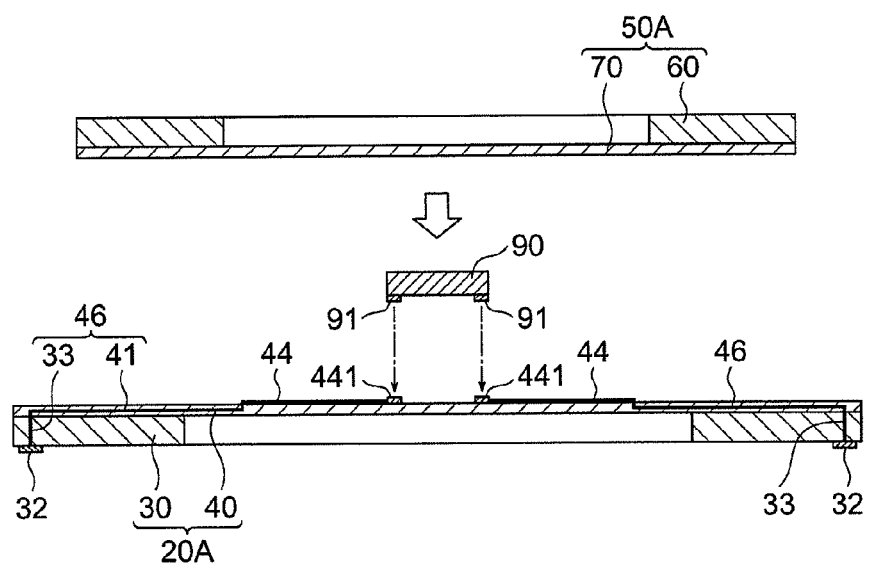
FIG. 7 is a disassembled perspective view which shows a first modification of the test carrier of the first embodiment of the present invention.

For example, like in the first modification which is shown in FIG. 7, it is also possible to form the second interconnect patterns 44 including the pads 441 on the base film 40 by ink jet printing and form conduction paths 46 which connect the second interconnect patterns 44 and the external terminals 32 on the base film 40 and the base frame 30 in advance.

Note that, the conduction paths 46 in this example include the first interconnect patterns 41 which are formed in advance on the base film 40 and the through holes 33 which are formed in advance in the base frame 30. Further, the through holes 33 electrically connect the first interconnect patterns 41 and the external terminals 32. Incidentally, in the first modification, the second interconnect patterns 44 correspond to one example of the second conduction paths in the present invention, while the conduction paths 46 correspond to one example of the first conduction paths in the present invention.

Figure 8:
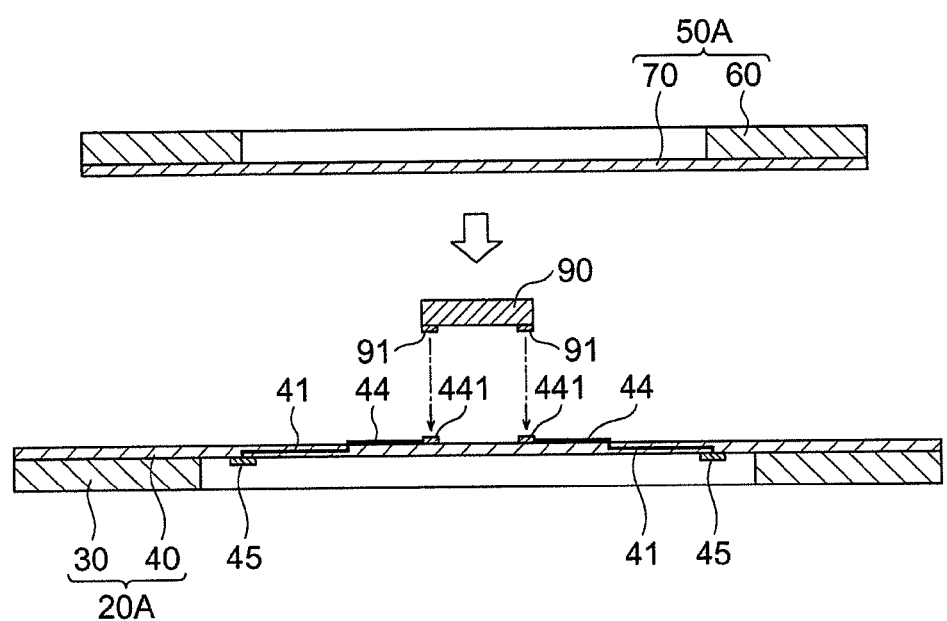
FIG. 8 is a disassembled perspective view which shows a second modification of the test carrier of the first embodiment of the present invention.

Further, like in the second modification which is shown in FIG. 8, it is also possible to form the pads 441 on the top surface of the base film 40 and form the external terminals 45 on the bottom surface of the base film 40.

Figure 9:
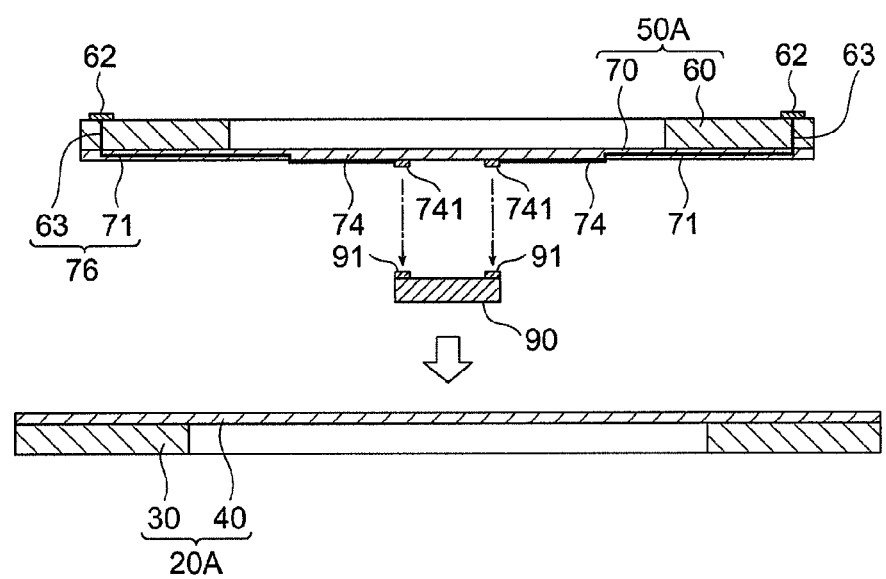
FIG. 9 is a disassembled perspective view which shows a third modification of the test carrier of the first embodiment of the present invention.

Further, like in the third modification which is shown in FIG. 9, it is also possible to form the second interconnect patterns 74 including the pads 741 on the cover film 70 by ink jet printing and form conduction paths 76 which connect the second interconnect patterns 74 and external terminals 62 on the cover film 70 and the cover frame 60 in advance.

Note that, the conduction paths 76 in the present example include the first interconnect patterns 71 which are formed in advance on the cover film 70 and the through holes 63 which are formed in advance in the cover frame 60. Further, the through holes 63 electrically connect the first interconnect patterns 71 and the external terminals 62. Incidentally, in this third modification, the second interconnect patterns 74 correspond to one example of the second conduction paths in the present invention, while the conduction path 76 correspond to one example of the first conduction paths in the present invention.

Figure 10:
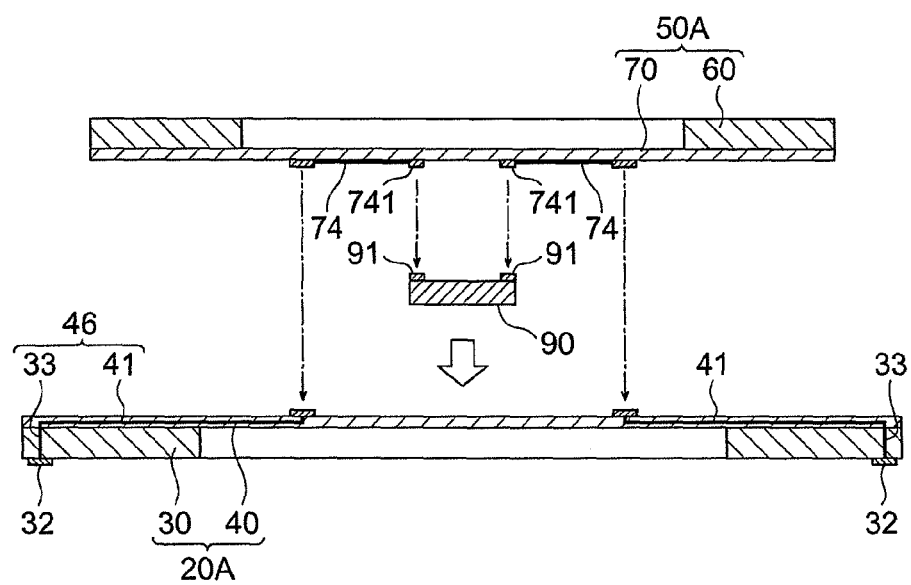
FIG. 10 is a disassembled perspective view which shows a fourth modification of the test carrier of the first embodiment of the present invention.

Further, like in the fourth modification which is shown in FIG. 10, it is also possible to form the second interconnect patterns 74 on the bottom surface of the cover film 70 by ink jet printing and form conduction paths 46 which connect the second interconnect patterns 74 and external terminals 32 on the base film 40 and the base frame 30 in advance.

Note that, the conduction paths 46 in the present example include the first interconnect patterns 41 which are formed in advance on the base film 40 and the through holes 33 which are formed in advance in the base frame 30. Further, the through holes 33 electrically connect the first interconnect patterns 41 and the external terminals 32. Incidentally, in this fourth modification, the second interconnect patterns 74 correspond to one example of the second conduction paths in the present invention, while the conduction paths 46 correspond to one example of the first conduction paths in the present invention.

Note that, in the example which is shown in FIG. 10, it is also possible to further provide interconnect patterns which are formed by ink jet printing on the base film 40 and which connect the first interconnect patterns 41 and the second interconnect patterns 74.

Figure 11:
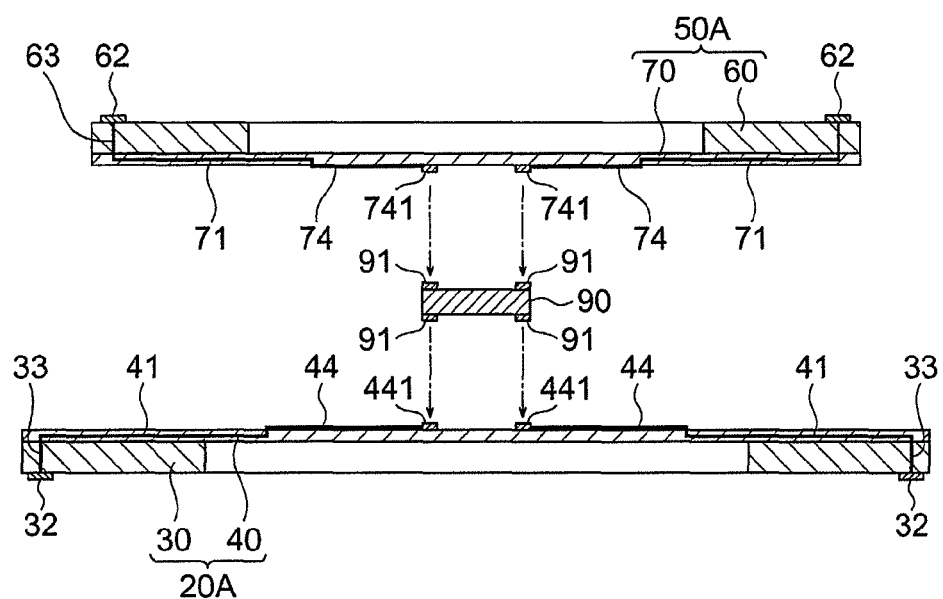
FIG. 11 is a disassembled perspective view which shows a fifth modification of the test carrier of the first embodiment of the present invention.

Furthermore, when the die 90 has electrodes 91 on its top surface and bottom surface, like in the fifth modification which is shown in FIG. 11, it is also possible to form the pads 441, 741 on both the base film 40 and cover film 70 and form the external terminal 32, 62 on both the base frame 30 and cover frame 60.

Returning to FIG. 2 to FIG. 4, the cover member 50A comprises a cover frame 60 and a cover film 70.

The cover frame 60 is a rigid board which has a high rigidity (rigidity higher than at least the base film 40 or cover film 70) and which is formed with an opening 61 at its center. This cover frame 60 is, for example, composed of a polyamide imide resin, ceramic, glass, etc.

The cover film 70 is a film which has pliability. It is attached over the entire surface of the cover frame 60, including the center opening 61, by a binder (not shown). This cover film 70 comprises, for example, a polyimide film etc. In this way, in the present embodiment, the cover film 70 which has pliability has the cover film 60 which is high in rigidity adhered to it, so the handling ability of the cover member 50A is improved.

The above explained test carrier 10 is assembled as follows.

That is, first, the electrodes 91 are aligned with the pads 441 and, in that state, the die 90 is placed on the base film 40 of the base member 20A.

Next, in an environment reduced in pressure compared with atmospheric pressure, the cover member 50A is placed on the base member 20A and the die 90 is inserted between the base member 20A and the cover member 50A. At this time, the cover member 50A is placed over the base member 20A so that the base film 40 and the cover film 70 directly contact each other.

Next, in the state with the die 90 clamped between the base member 20A and the cover member 50A, the test carrier 10 is returned to an atmospheric pressure environment whereby the die 90 is held inside the holding space 11 which is formed between the base member 20A and the cover member SOA (see FIG. 3).

Note that, the electrodes 91 of the die 90 and the pads 441 of the base film 40 are not fastened by solder etc. In the present embodiment, the holding space 11 is reduced in pressure compared with the outside air, so the base film 40 and the cover film 70 press against the die 90 whereby the electrodes 91 of the die 90 and the pads 441 of the base film 40 contact each other.

As shown in FIG. 3, to maintain the air-tightness of the holding space 11, the base member 20A and the cover member 50A are fastened together by the bonded part 80. As the binder 81 which forms this bonded part 80, for example, a UV curing type binder can be illustrated.

This binder 81, as shown in FIG. 2, FIG. 4, FIG. 5, and FIG. 6, is coated at positions of the base member 20A facing the outer circumference of the cover member 50A. Further, the base member 20A is covered by the cover member 50A, then UV rays are fired toward the binder 81 to make the binder 81 cure whereby a bonded part 80 is formed. Note that, when adhesion between the base member 20A and cover member 50A can be secured by just reduced pressure, a binder need not be used.

Figure 12:
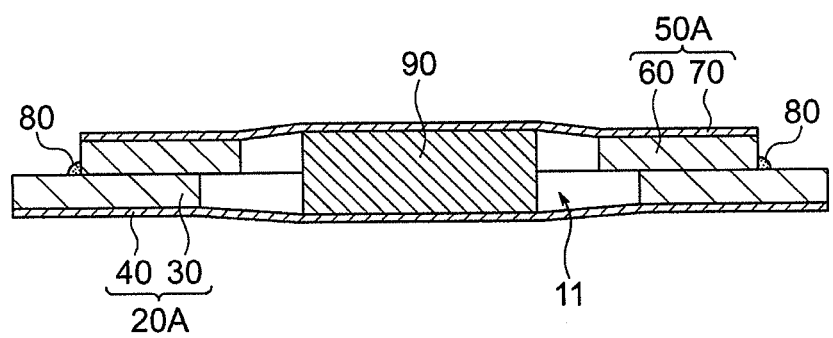
FIG. 12 is a disassembled perspective view which shows a sixth modification of the test carrier of the first embodiment of the present invention.

Note that, when the die 90 is relatively thick, like in the sixth modification which is shown in FIG. 12, the cover member 50A may be laid over the base member 20A so that the base frame 30 and the cover frame 60 directly contact each other.

Second Embodiment

Figure 13:
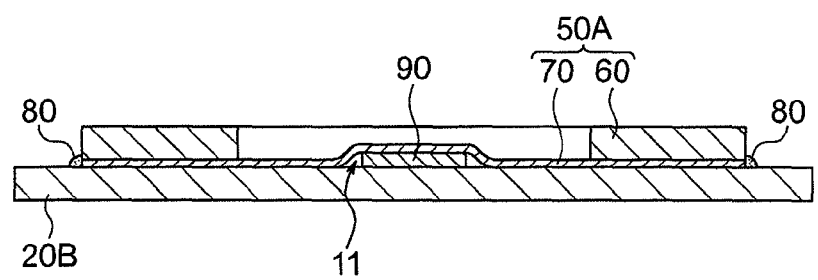
FIG. 13 is a cross-sectional view which shows a test carrier in a second embodiment of the present invention.

FIG. 13 is a view showing a test carrier in a second embodiment of the present invention.

In the present embodiment, the base member differs in configuration from the first embodiment (see FIG. 3), but the rest of the configuration is similar to the first embodiment. Below, only the points of difference of the test carrier in the second embodiment from the first embodiment will be explained. Parts configured similar to the first embodiment are assigned the same reference notations and explanations thereof are omitted.

As shown in FIG. 13, the base member 20B in the present embodiment comprises only a flat-plate shaped rigid board which has a high rigidity (at least a higher rigidity than the cover film 70), but does not have a center opening. This base member 20B is, for example, composed of polyamide imide resin or ceramic, glass, etc.

In the present embodiment, while not particularly shown, the first interconnect patterns are formed on this base member 20B in advance, while the second interconnect patterns are formed on the base member 20B by ink jet printing in real time. Note that, by forming the base member 20B by for example a single layer or multilayer printed circuit board, it is possible to form the first interconnect patterns on the base member 20B.

In the present embodiment, the second interconnect patterns are formed on this base member 20B by ink jet printing in real time, so a single test carrier can be used to handle numerous types of dies.

Further, in the present embodiment, the base member 20B has the first interconnect patterns formed in advance, so the range of ink jet printing can be made smaller, the printing time of the second interconnect patterns can be shortened, and the productivity of the test carrier can be improved.

Note that in the example shown in FIG. 13, the cover member 50A is laid over the base member 20B so that the cover film 70 and base member 20B directly contact each other, but the invention is not particularly limited to this. For example, when the die 90 is relatively thick, while not particularly shown, the cover member 50A may be laid over the base member 20B so that the cover frame 60 and the base member 20B directly contact each other.

Third Embodiment

Figure 14:
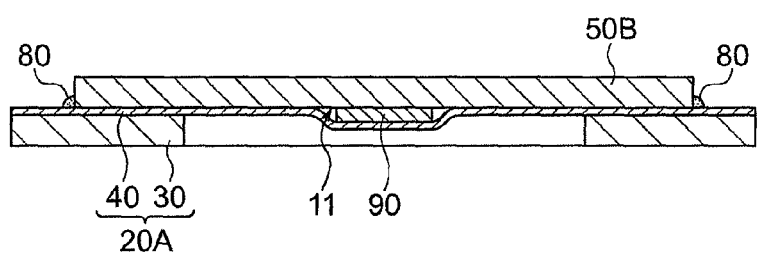
FIG. 14 is a cross-sectional view which shows a test carrier in a third embodiment of the present invention.

FIG. 14 is a view showing a test carrier in a third embodiment of the present invention.

In the present embodiment, the cover member differs in configuration from the first embodiment (see FIG. 3), but the rest of the configuration is similar to the first embodiment. Below, only the points of difference of the test carrier in the third embodiment from the first embodiment will be explained. Parts configured similar to the first embodiment are assigned the same reference notations and explanations thereof are omitted.

As shown in FIG. 14, the cover member 50B in the present embodiment comprises only a flat-plate shaped rigid board which has a high rigidity (at least a higher rigidity than the base film 40), but does not have a center opening. This cover member 50B is, for example, composed of polyamide imide resin, ceramic, glass, etc.

In the present embodiment, the second interconnect patterns 44 are formed on this base member 20A by ink jet printing in real time, so a single test carrier can be used to handle numerous types of dies.

Further, in the present embodiment, the base member 20A has the first interconnect patterns 41 formed in advance, so the range of ink jet printing can be made smaller, the printing time of the second interconnect patterns can be shortened, and the productivity of the test carrier can be improved.

Note that, in the example shown in FIG. 14, the cover member 50B is laid over the base member 20A so that the base film 40 and the cover member 50B directly contact each other, but the invention is not particularly limited to this. For example, when the die 90 is relatively thick, while not particularly shown, the cover member 50B may be laid over the base member 20A so that the base frame 30 and the cover member 50B directly contact each other.

Fourth Embodiment

Figure 15:
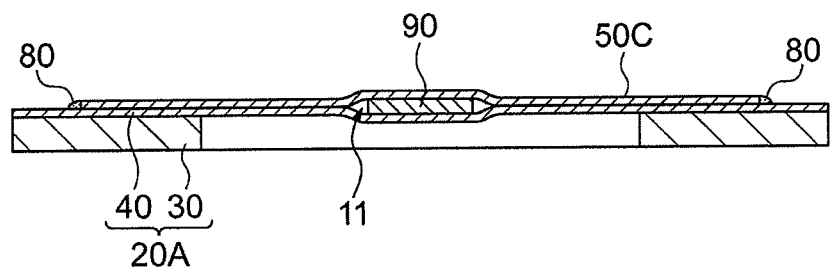
FIG. 15 is a cross-sectional view which shows a test carrier in a fourth embodiment of the present invention.

FIG. 15 is a view showing a test carrier in a fourth embodiment of the present invention.

In the present embodiment, the cover member differs in configuration from the first embodiment (see FIG. 3), but the rest of the configuration is similar to the first embodiment. Below, only the points of difference of the test carrier in the fourth embodiment from the first embodiment will be explained. Parts configured similar to the first embodiment are assigned the same reference notations and explanations thereof are omitted.

As shown in FIG. 15, the cover member 50C in the present embodiment comprises only a film having pliability. This cover member 50C comprises, for example, a polyimide film etc.

In the present embodiment, the second interconnect patterns 44 are formed on the base member 20A by ink jet printing in real time, so a single test carrier can be used to handle numerous types of dies.

Further, in the present embodiment, the base member 20A has the first interconnect patterns 41 formed in advance, so the range of ink jet printing can be made smaller, the printing time of the second interconnect patterns can be shortened, and the productivity of the test carrier can be improved.

Note that, in the example shown in FIG. 15, the cover member 50C is laid over the base member 20A so that the base film 40 and the cover member 50C directly contact each other, but the invention is not particularly limited to this. For example, when the die 90 is relatively thick, while not particularly shown, the cover member 50C may be laid over the base member 20A so that the base frame 30 and the cover member 50C directly contact each other.

Fifth Embodiment

Figure 16:
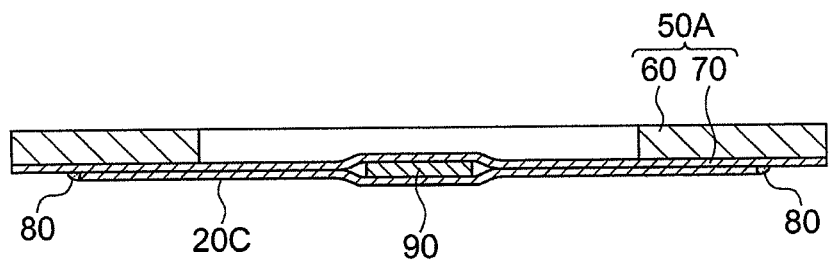
FIG. 16 is a cross-sectional view which shows a test carrier in a fifth embodiment of the present invention.

FIG. 16 is a view showing a test carrier in a fifth embodiment of the present invention.

In the present embodiment, the base member differs in configuration from the first embodiment (see FIG. 3), but the rest of the configuration is similar to the first embodiment. Below, only the points of difference of the test carrier in the fifth embodiment from the first embodiment will be explained. Parts configured similar to the first embodiment are assigned the same reference notations and explanations thereof are omitted.

As shown in FIG. 16, the base member 20C in the present embodiment comprises only a film having pliability. This base member 20C comprises, for example, a polyimide film etc.

In the present embodiment, while not particularly shown, the first interconnect patterns are formed on this base member 20C in advance, while the second interconnect patterns are formed on the base member 20C by ink jet printing in real time.

In the present embodiment, the second interconnect patterns are formed on this base member 20C by ink jet printing in real time, so a single test carrier can be used to handle numerous types of dies.

Further, in the present embodiment, the base member 20C has the first interconnect patterns formed in advance, so the range of ink jet printing can be made smaller, the printing time of the second interconnect patterns can be shortened, and the productivity of the test carrier can be improved.

Note that, in the example shown in FIG. 16, the cover member 50A is laid over the base member 20C so that the base member 20C and the cover film 70 directly contact each other, but the invention is not particularly limited to this. For example, when the die 90 is relatively thick, while not particularly shown, the cover member 50A may be laid over the base member 20C so that the base member 20C and the cover frame 60 directly contact each other.

Sixth Embodiment

Figure 17:
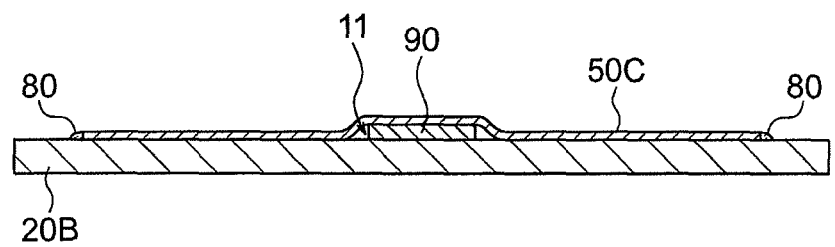
FIG. 17 is a cross-sectional view which shows a test carrier in a sixth embodiment of the present invention.

FIG. 17 is a view showing a test carrier in a sixth embodiment of the present invention.

In the present embodiment, the cover member differs in configuration from the second embodiment (see FIG. 13), but the rest of the configuration is similar to the second embodiment. Below, only the points of difference of the test carrier in the sixth embodiment from the second embodiment will be explained. Parts configured similar to the second embodiment are assigned the same reference notations and explanations thereof are omitted.

As shown in FIG. 17, the cover member 50C in the present embodiment comprises only a film which has pliability. This cover member 50C comprises, for example, a polyimide film etc.

In the present embodiment, the second interconnect patterns are formed on this base member 20B by ink jet printing in real time, so a single test carrier can be used to handle numerous types of dies.

Further, in the present embodiment, the base member 20B has the first interconnect patterns formed in advance, so the range of ink jet printing can be made smaller, the printing time of the second interconnect patterns can be shortened, and the productivity of the test carrier can be improved.

Seventh Embodiment

Figure 18:
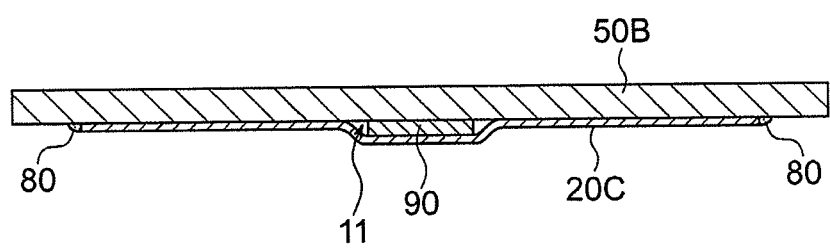
FIG. 18 is a cross-sectional view which shows a test carrier in a seventh embodiment of the present invention.

FIG. 18 is a view showing a test carrier in a seventh embodiment of the present invention.

In the present embodiment, the cover member differs in configuration from the fifth embodiment (see FIG. 16), but the rest of the configuration is similar to the fifth embodiment. Below, only the points of difference of the test carrier in the seventh embodiment from the fifth embodiment will be explained. Parts configured similar to the fifth embodiment are assigned the same reference notations and explanations thereof are omitted.

As shown in FIG. 18, the cover member 50B in the present embodiment comprises only a flat-plate-shaped rigid board which has a high rigidity (at least a higher rigidity than the base member 20c), but does not have a center opening. This cover member 50B is, for example, composed of a polyamide imide resin or ceramic, glass, etc.

In the present embodiment, the second interconnect patterns are formed on this base member 20C by ink jet printing in real time, so a single test carrier can be used to handle numerous types of dies.

Further, in the present embodiment, the base member 20C has the first interconnect patterns formed in advance, so the range of ink jet printing can be made smaller, the printing time of the second interconnect patterns can be shortened, and the productivity of the test carrier can be improved.

Eighth Embodiment

Figure 19:
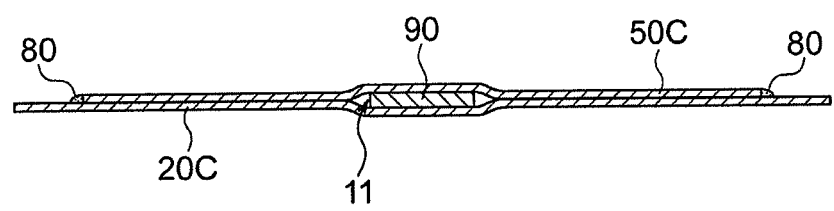
FIG. 19 is a cross-sectional view which shows a test carrier in an eighth embodiment of the present invention.

FIG. 19 is a view showing a test carrier in an eighth embodiment of the present invention.

In the present embodiment, the cover member differs in configuration from the fifth embodiment (see FIG. 16), but the rest of the configuration is similar to the fifth embodiment. Below, only the points of difference of the test carrier in the eighth embodiment from the fifth embodiment will be explained. Parts configured similar to the fifth embodiment are assigned the same reference notations and explanations thereof are omitted.

As shown in FIG. 19, the cover member 50C in the present embodiment comprises only a film having pliability. This cover member 50C comprises, for example, a polyimide film etc.

In the present embodiment, the second interconnect patterns are formed on this base member 20C by ink jet printing in real time, so a single test carrier can be used to handle numerous types of dies.

Further, in the present embodiment, the base member 20C has the first interconnect patterns formed in advance, so the range of ink jet printing can be made smaller, the printing time of the second interconnect patterns can be shortened, and the productivity of the test carrier can be improved.

Each of the base members 20A to 20C in the first to eighth embodiments explained above correspond to one example of one of the first member or second member in the present invention, while each of the cover members 50A to 50C in the first to eighth embodiment correspond to one example of the other of the second or first member in the present invention.

Note that the embodiments explained above were described for facilitating understanding of the present invention and were not described for limiting the present invention. Therefore, the elements disclosed in the above embodiments include all design modifications and equivalents falling under the technical scope of the present invention.

For example, in the second to eighth embodiments shown in FIG. 13 to FIG. 19, conduction paths such as shown in FIG. 7 to FIG. 11 may also be employed.

REFERENCE SIGNS LIST

10 . . . test carrier
11 . . . holding space
20A to 20C . . . base member
21 . . . first region
22 . . . second region 30 . . . base frame
31 . . . center opening
40 . . . base film
41 . . . first interconnect patterns
42 . . . base layer
43 . . . cover layer
44 . . . second interconnect patterns
441 . . . pad
45 . . . external terminal
46 . . . conduction path
47 . . . insulating layer
50A to 50C . . . cover member
60 . . . cover frame
61 . . . center opening
70 . . . cover film
80 . . . bonding part
81 . . . binder
90 . . . die
91 . . . electrodes

The invention claimed is:

1. A test carrier which comprises a first member and a second member between which an electronic device is interposed, wherein
the first member has first conduction paths which are formed in advance, and
one of the first member or the second member has a first printing region where second conduction paths which are electrically connected to the first conduction paths are to be formed by printing,
wherein the first member has:
a first film; and
a first frame which is formed with a first opening and to which the first film is adhered,
the second member has:
a second film which faces the first film; and
a second frame which is formed with a second opening and to which the second film is adhered,
the first printing region is provided on one of the first film or the second film, and
the electronic device is interposed between the first film and the second film.

2. The test carrier as set forth in claim 1, wherein the first conduction paths are connected to external terminals which are provided on the first film.

3. The test carrier as set forth in claim 1, wherein
the first conduction paths are connected to external terminals which are provided on the first frame.

4. The test carrier as set forth in claim 1, wherein
the electronic device is a die which is obtained by dicing from a semiconductor wafer.

5. The test carrier as set forth in claim 1, wherein
a holding space which is formed between the first member and the second member and which holds the electronic device is reduced in pressure compared with the outside air.

6. The test carrier as set forth in claim 1, wherein
the first printing region is defined by a continuous region extending around a position at which the electronic device is configured to be placed, the continuous region having a surface that is configured to be provided with the second conduction paths.

7. The test carrier as set forth in claim 1, wherein
one of the first member or the second member has:
the second conduction paths; and
an insulating layer which is formed over the parts of the second conduction paths corresponding to the edge of the electronic device.

8. The test carrier as set forth in claim 7, wherein the second conduction paths have pads which contact electrodes of the electronic device.

* * * * *